(12) United States Patent
Rinne

(10) Patent No.: US 7,495,326 B2
(45) Date of Patent: Feb. 24, 2009

(54) STACKED ELECTRONIC STRUCTURES INCLUDING OFFSET SUBSTRATES

(75) Inventor: Glenn A. Rinne, Apex, NC (US)

(73) Assignee: Unitive International Limited, Curacao (AN)

( * ) Notice: Subject to any disclaimer, the term of this patent is extended or adjusted under 35 U.S.C. 154(b) by 853 days.

(21) Appl. No.: 10/689,976

(22) Filed: Oct. 21, 2003

(65) Prior Publication Data

US 2004/0124520 A1    Jul. 1, 2004

Related U.S. Application Data

(60) Provisional application No. 60/420,422, filed on Oct. 22, 2002.

(51) Int. Cl.
*H01L 23/02* (2006.01)
(52) U.S. Cl. .................. 257/686; 257/777; 257/723; 257/783; 257/786; 257/778; 257/773; 257/776; 257/E23.021; 257/E23.031; 257/E23.048
(58) Field of Classification Search ................. 361/760, 361/790, 784, 748; 257/697, 699, 700, 723, 257/737, 735, 777, 686, 783, 786, 778, 773, 257/776, E23.031, E23.021, E23.048
See application file for complete search history.

(56) References Cited

U.S. PATENT DOCUMENTS

| | | | |
|---|---|---|---|
| 3,105,869 A | 10/1963 | Branch et al. | |
| 3,501,681 A | 3/1970 | Weir | |
| 3,663,184 A | 5/1972 | Wood et al. | |
| 3,760,238 A | 9/1973 | Hamer et al. | |
| 3,770,874 A | 11/1973 | Krieger et al. | |
| 3,871,014 A | 3/1975 | King et al. | |

(Continued)

FOREIGN PATENT DOCUMENTS

EP    1 248 295 A2    10/2002

(Continued)

OTHER PUBLICATIONS

International Search Report for PCT/US 03/33211.

(Continued)

*Primary Examiner*—Lynne A. Gurley
*Assistant Examiner*—Junghwa Im
(74) *Attorney, Agent, or Firm*—Myers Bigel Sibley & Sajovec

(57) ABSTRACT

An electronic device may include first, second, and third substrates wherein the second electronic substrate is between the first and second electronic substrates. A first electrical and mechanical connection may be provided between the first and third electronic substrates, and a second electrical and mechanical connection may be provided between the second and third electronic substrates. In addition or in an alternative, an electronic device may include a printed circuit board, a first electronic substrate on the printed circuit board, a second electronic substrate on the first electronic substrate, and a third electronic substrate on the second electronic substrate. More particularly, the first electronic substrate may be between the printed circuit board and the second electronic substrate, and the second electronic substrate may be between the first and third electronic substrates. In addition, the second electronic substrate may be offset relative to the first and third electronic substrates so that a first end of the second electronic substrate extends beyond the first and third electronic substrates and so that the first and third electronic substrates extend beyond a second end of the second electronic substrate.

71 Claims, 7 Drawing Sheets

U.S. PATENT DOCUMENTS

| | | | |
|---|---|---|---|
| 3,897,871 | A | 8/1975 | Zimnbauer |
| 3,942,187 | A | 3/1976 | Gelsing et al. |
| 4,074,342 | A | 2/1978 | Honn et al. |
| 4,113,578 | A | 9/1978 | Del Monte |
| 4,382,517 | A | 5/1983 | Welsch |
| 4,473,263 | A | 9/1984 | Sunstein |
| 4,532,576 | A | 7/1985 | Reimer |
| 4,657,146 | A | 4/1987 | Walters |
| 4,855,809 | A | 8/1989 | Malhi et al. |
| 4,948,754 | A | 8/1990 | Kondo et al. |
| 4,950,623 | A | 8/1990 | Dishon |
| 4,962,058 | A | 10/1990 | Cronin et al. |
| 5,022,580 | A | 6/1991 | Pedder |
| 5,113,314 | A | 5/1992 | Wheeler et al. |
| 5,160,409 | A | 11/1992 | Moore et al. |
| 5,162,257 | A | 11/1992 | Yung |
| 5,194,137 | A | 3/1993 | Moore et al. |
| 5,239,447 | A | 8/1993 | Cotues et al. |
| 5,240,881 | A | 8/1993 | Cayetano et al. |
| 5,250,843 | A | 10/1993 | Eichelberger |
| 5,289,925 | A | 3/1994 | Newmark |
| 5,293,006 | A | 3/1994 | Yung |
| 5,327,013 | A | 7/1994 | Moore et al. |
| 5,327,327 | A | 7/1994 | Frew et al. |
| 5,335,795 | A | 8/1994 | Chizen |
| 5,347,428 | A | 9/1994 | Carson et al. |
| 5,354,711 | A | 10/1994 | Heitzmann et al. |
| 5,406,701 | A | 4/1995 | Pepe et al. |
| 5,424,920 | A | 6/1995 | Miyake |
| 5,432,729 | A | 7/1995 | Carson et al. |
| 5,453,582 | A | 9/1995 | Amano et al. |
| 5,616,962 | A | 4/1997 | Ishikawa et al. |
| 5,680,296 | A | 10/1997 | Hileman et al. |
| 5,739,053 | A | 4/1998 | Kawakita et al. |
| 5,744,382 | A | 4/1998 | Kitayama et al. |
| 5,751,556 | A | 5/1998 | Butler et al. |
| 5,760,478 | A * | 6/1998 | Bozso et al. ............... 257/777 |
| 5,793,116 | A | 8/1998 | Rinne et al. |
| 5,963,793 | A | 10/1999 | Rinne et al. |
| 5,977,640 | A * | 11/1999 | Bertin et al. ............... 257/777 |
| 6,082,610 | A * | 7/2000 | Shangguan et al. .... 228/180.22 |
| 6,369,448 | B1 * | 4/2002 | McCormick ............... 257/777 |
| 6,388,333 | B1 | 5/2002 | Taniguchi et al. |
| 6,392,292 | B1 * | 5/2002 | Morishita ................... 257/686 |
| 6,563,205 | B1 * | 5/2003 | Fogal et al. ................. 257/777 |
| 6,621,155 | B1 * | 9/2003 | Perino et al. ............... 257/686 |
| 6,627,980 | B2 * | 9/2003 | Eldridge ..................... 257/678 |
| 6,731,009 | B1 * | 5/2004 | Jones et al. ................. 257/777 |
| 6,768,208 | B2 * | 7/2004 | Lin et al. .................... 257/686 |
| 6,900,528 | B2 * | 5/2005 | Mess et al. ................. 257/686 |
| 2002/0005577 | A1 | 1/2002 | Shimoda |
| 2003/0122240 | A1 * | 7/2003 | Lin et al. .................... 257/686 |
| 2005/0146010 | A1 * | 7/2005 | Moden et al. .............. 257/686 |

FOREIGN PATENT DOCUMENTS

| | | |
|---|---|---|
| FR | 2 688 628 | 9/1993 |
| JP | 55-111127 | 8/1980 |
| JP | 57-73952 | 5/1982 |
| JP | 57-197838 | 12/1982 |
| JP | 58-92230 | 1/1983 |
| JP | 58092230 | 1/1983 |
| JP | 59-154041 | 9/1984 |
| JP | 6-116552 | 1/1986 |
| JP | 63-222245 | 9/1988 |
| JP | 63-222445 | 9/1988 |
| JP | 4-150033 | 5/1992 |

OTHER PUBLICATIONS

Howell et al: "Area Array Solder Interconnection Technology for the Three-Dimensional Silicon Cube", Proceedings of the 1995 45th Electronic Components & Technology Conference, pp. 1174-1178.

Lineback, "3D IC Packaging Moves Closer to Comercial Use", Electronic World News, May 21, 1990, p. 15.

* cited by examiner

STACKED ELECTRONIC STRUCTURES INCLUDING OFFSET SUBSTRATES

RELATED APPLICATION

This application claims priority from U.S. Provisional Patent Application No. 60/420,422 filed on Oct. 22, 2002, the disclosure of which is hereby incorporated herein by reference in its entirety.

FIELD OF THE INVENTION

The present invention relates to the field of electronics, and more particularly to stacked electronic structures.

BACKGROUND

In packaging microelectronic devices, such as packaging integrated circuit chips on printed circuit boards, the integrated circuit chips are generally mounted parallel to and facing the printed circuit board such that faces of the integrated circuit chips are adjacent a face of the circuit board. This packaging technology allows a large number of input/output connections between the integrated circuit chips and the printed circuit board, especially when solder bump technology is used over the entire face of the integrated circuit chips. However, this technology may limit a packaging density because the large faces of the integrated circuit chips are mounted adjacent the face of the printed circuit board.

SUMMARY OF THE INVENTION

According to embodiments of the present invention, an electronic device may include first, second, and third electronic substrates wherein the second electronic substrate may be provided between the first and third electronic substrates. More particularly, a first electrical and mechanical connection may be provided between the first and third electronic substrates, and a second electrical and mechanical connection may be provided between the second and third electronic substrates.

In addition, the second electronic substrate may be offset relative to the first and third electronic substrates so that a first end of the second electronic substrate extends beyond the first and third electronic substrates and so that the first and third electronic substrates extend beyond a second end of the second electronic substrate. The first electrical and mechanical connection may thus be between portions of the first and third electronic substrates extending beyond the second end of the second electronic substrate. Moreover, a conductive trace may be provided on a surface of the third electronic substrate, with the conductive trace providing an electrical coupling between the first and second electrical and mechanical connections.

The electronic device may also include a third electrical and mechanical connection between the first and second electronic substrates, and a conductive trace on a surface of the first electronic substrate. More particularly, the conductive trace may provide an electrical coupling between the first and third electrical and mechanical connections.

The first electrical and mechanical connection may include a first conductive bump between the first and third electronic substrates, and the second electrical and mechanical connection may include a second conductive bump between the second and third electronic substrates. More particularly, the first and second conductive bumps may be solder bumps, and/or the first conductive bump may have a greater volume than the second conductive bump.

Each of the first and third electronic substrates may include a device side having electronic circuits (such as transistors, diodes, resistors, capacitors, inductors, etc.) thereon and a backside free of electronic circuits. Moreover, a backside of the first electronic substrate may be adjacent the second electronic substrate, and a device side of the third electronic substrate may be adjacent the second electronic substrate. More particularly, both of the first and third electronic substrates may be memory devices, and both of the first and second electrical and mechanical connections can be electrically coupled to a data input, a data output, and/or an address input of the third electronic substrate. The second electronic substrate may also be a memory device, and both of the first and second electrical and mechanical connections can also be electrically coupled to a data input, a data output, and/or an address input of the second electronic substrate, and to a data input, a data output, and/or an address input of the first electronic substrate. The first, second, and third substrates can also have a same electrical layout such as a same integrated circuit memory layout.

The electronic device may also include a printed circuit board, with the first and third electronic substrates being integrated circuit device substrates having devices sides facing the printed circuit board and having backsides facing away from the printed circuit board. In addition, a third electrical and mechanical connection may be provided between the first electronic substrate and the printed circuit board, a fourth electrical and mechanical connection may be provided between the second electronic substrate and the printed circuit board, and a fifth electrical and mechanical connection may be provided between the second electronic substrate and the first electronic substrate.

The printed circuit board may include a first conductive pad to which the third electrical and mechanical connection is bonded and a second conductive pad to which the fourth electrical and mechanical connection is bonded, and the first conductive pad may have a greater surface area than the second conductive pad. In addition, a first conductive trace may be provided on the printed circuit board providing electrical coupling between the third and fourth electrical and mechanical connections, a second conductive trace may be provided on the second electronic substrate providing electrical coupling between the fourth and fifth electrical and mechanical connections, and a third conductive trace may be provided on the first electronic substrate providing electrical coupling between the fifth and first electrical and mechanical connections. Moreover, the first and third electrical and mechanical connections may be electrically coupled to a data input, a data output, and/or an address input of the first electronic substrate, and the first and third electrical and mechanical connections may be electrically coupled to a data input, a data output, and/or an address input of the third electronic substrate.

The electronic device may also include a fourth electronic substrate on the third electronic substrate so that the third electronic substrate is between the second and fourth electronic substrates, and a fifth electronic substrate on the fourth electronic substrate so that the fourth electronic substrate is between the third and fifth electronic substrates. In addition, a third electrical and mechanical connection may be provided between the second and fourth electronic substrates, a fourth electrical and mechanical connection may be provided between the fourth and third electronic substrates, and a fifth electrical and mechanical connection may be provided between the third and fifth electronic substrates. Moreover, the first, second, third, fourth and fifth electrical and mechanical connections may provide portions of a signal path, with an electrical coupling being provided between the signal path and an electronic circuit of the fifth electronic substrate. In addition, the signal path may be free of electrical coupling with an electronic circuit of the third electronic substrate. Unique signal paths may thus be provided for particular electronic substrates in the device.

The electronic device may also include a heat dissipating layer between the first and second electronic substrates, and the heat dissipating layer may include a material that is thermally conductive and electrically insulating. Moreover, heat dissipating layers may be provided between each adjacent electronic substrate in the device, and the plurality of heat dissipating layers may be coupled to a heat sink adjacent edges of the electronic substrates.

According to additional embodiments of the present invention, an electronic device may include a printed circuit board, and first, second, and third electronic substrates. The first electronic substrate may be on the printed circuit board, and the second electronic substrate may be on the first electronic substrate with the first electronic substrate being between the printed circuit board and the second electronic substrate. The third electronic substrate may be on the second electronic substrate with the second electronic substrate being between the first and third electronic substrates. In addition, the second electronic substrate may be offset relative to the first and third electronic substrates so that a first end of the second electronic substrate extends beyond the first and third electronic substrates and so that the first and third electronic substrates extend beyond a second end of the second electronic substrate.

In addition, a first electrical and mechanical connection may be provided between the first and third electronic substrates, and a second electrical and mechanical connection may be provided between the second and third electronic substrates. More particularly, the first electrical and mechanical connection may be between portions of the first and third electronic substrates extending beyond the second end of the second electronic substrate. A conductive trace may also be provided on a surface of the third electronic substrate, and the conductive trace may provide an electrical coupling between the first and second electrical and mechanical connections. A third electrical and mechanical connection may be provided between the first and second electronic substrates, and a conductive trace on a surface of the first electronic substrate may provide an electrical coupling between the first and third electrical and mechanical connections.

The first electrical and mechanical connection may include a first conductive bump between the first and third electronic substrates, and the second electrical and mechanical connection may include a second conductive bump between the second and third electronic substrates. Moreover, the first conductive bump may have a greater volume than the second conductive bump, and/or the first and second conductive bumps may be solder bumps.

Each of the first and third electronic substrates may include a device side having electronic circuits (such as transistors, diodes, resistors, capacitors, and/or inductors) thereon and a backside free of electronic circuits, wherein a backside of the first electronic substrate is adjacent the second electronic substrate and wherein a device side of the third electronic substrate is adjacent the second electronic substrate. Both of the first and third electronic substrates may be memory devices. In addition, a first electrical and mechanical connection may be provided between the first and third electronic substrates, and a second electrical and mechanical coupling may be provided between the second and third electronic substrates. Moreover, both of the first and second electrical and mechanical connections may be electrically coupled to a data input, a data output, and/or an address input of the third electronic substrate. The second electronic substrate may also be a memory device, and both of the first and second electrical and mechanical connections may be electrically coupled to a data input, a data output, and/or an address input of the second electronic substrate, and to a data input, a data output, and/or an address input of the first electronic substrate. More particularly, the first, second, and third electronic substrates may have a same integrated circuit memory device layout.

The first and third electronic substrates may be integrated circuit device substrates having devices sides facing the printed circuit board and backsides facing away from the printed circuit board. In addition, a first electrical and mechanical connection may be provided between the first and third electronic substrates, a second electrical and mechanical connection between the second and third electronic substrates, and a third electrical and mechanical connection between the first electronic substrate and the printed circuit board. A fourth electrical and mechanical connection may also be provided between the second electronic substrate and the printed circuit board, and a fifth electrical and mechanical connection may be provided between the second electronic substrate and the first electronic substrate.

The printed circuit board may include a first conductive pad to which the third electrical and mechanical connection is bonded and a second conductive pad to which the fourth electrical and mechanical connection is bonded, and the first conductive pad may have a greater surface area than the second conductive pad. In addition, a first conductive trace may be provided on the printed circuit board providing electrical coupling between the third and fourth electrical and mechanical connections, and a second conductive trace may be provided on the second electronic substrate providing electrical coupling between the fourth and fifth electrical and mechanical connections. A third conductive trace may also be provided on the first electronic substrate providing electrical coupling between the fifth and first electrical and mechanical connections. The first and third electrical and mechanical connections may also be electrically coupled to a data input, a data output, and/or an address input of the first electronic substrate, and the first and third electrical and mechanical connections may be electrically coupled to a data input, a data output, and/or an address input of the third electronic substrate.

A fourth electronic substrate may be provided on the third electronic substrate with the third electronic substrate between the second and fourth electronic substrates, and a fifth electronic substrate may be provided on the fourth electronic substrate with the fourth electronic substrate between the third and fifth electronic substrates. In addition, the fourth electronic substrate may be offset relative to the first, third, and fifth electronic substrates so that a first end of the second electronic substrate extends beyond the first, third, and fifth electronic substrates, and so that the first, third, and fifth electronic substrates extend beyond a second end of the fourth electronic substrate. In addition, a heat dissipating layer may be provided between the first and second electronic substrates wherein the heat dissipating layer includes a material that is thermally conductive and electrically insulating.

According to still additional embodiments of the present invention, an electronic device may include first, second, and third electronic substrates, with the second electronic substrate being between the first and third electronic substrates and with each electronic substrate having opposing first and second sides. In addition, a signal path may extend along the first surface of the second electronic substrate, to the second surface of the first electronic substrate, along the second surface of the first electronic substrate, to the first surface of the third electronic substrate, along the first surface of the third electronic substrate, and to the second surface of the second electronic substrate.

The signal path may include a first conductive trace on the first surface of the second electronic substrate, a first electrical and mechanical connection between the first surface of the second electronic substrate and the second surface of the first electronic substrate, and a second conductive trace on the second surface of the first electronic substrate. The signal path may also include a second electrical and mechanical connection between the second surface of the first electronic substrate and the first surface of the third electronic substrate, a third conductive trace of the first surface of the third electronic substrate, and a third electrical and mechanical connection between the first surface of the third electronic substrate and the second surface of the second electronic substrate. More particularly, the first, second, and third electrical and mechanical connections may be respective conductive bumps.

The first and third electronic substrates may be integrated circuit devices, the first side of the first and third electronic substrates may be a device side, and the second side of the first and third electronic substrates may be a backside. The signal path may be electrically coupled to an electronic circuit of the third electronic substrate. The second electronic substrate may also be an integrated circuit device, the first side of the second electronic substrate may be a device side, and the second side of the second electronic substrate may be a backside. The signal path may be electrically coupled to an electronic circuit of the second electronic substrate and to an electronic circuit of the third electronic substrate. Moreover, the first, second, and third electronic substrates may be respective memory devices.

The electronic device may also include a fourth electronic substrate on the third electronic substrate wherein the third electronic substrate is between the second and fourth electronic substrates. The signal path may thus further extend along the second surface of the second electronic substrate, and to a first surface of the fourth electronic substrate. The signal path may also be electrically coupled with electronic circuits of the second and fourth substrates. In addition, the signal path can be electrically coupled with an electronic circuit of the fourth electronic substrate, and the signal path may be free of electrical coupling with an electronic circuit of the second electronic substrate. Accordingly, a unique signal path may be provided for a particular electronic substrate of the device. In addition, a heat dissipating layer may be provided between the first and second electronic substrates, and the heat dissipating layer may include a material that is thermally conductive and electrically insulating.

According to yet additional embodiments of the present invention, an electroinic device may include a substrate having opposing first and second surfaces, a first array of interconnection structures on the first surface of the substrate, and a second array of interconnection structures on the second surface of the substrate. The first array of interconnection structures can be arranged in a first pattern, and the second array of interconnection structures can be arranged in a second pattern. More particularly, the second pattern can be mirror image of the first pattern.

The first array of interconnection structures may include an array of interconnection bumps, and the second array of interconnection structures may include an array of conductive pads free of interconnection bumps. More particularly, the interconnection bumps may be solder bumps, and the conductive pads may be solder wettable pads.

In addition, a third array of interconnection structures may be provided on the first face of the substrate arranged in a third pattern, and a fourth array of interconnection structures may be provided on the second face of the substrate arranged in a fourth pattern. Moreover, the third array of interconnection structures may be spaced apart from the first array of interconnection structures, and the fourth array of interconnections structures may be spaced apart from the second array of interconnection structures. In addition, the fourth pattern may be a mirror image of the third pattern. In addition, a first plurality of conductive traces on the first surface of the substrate may provide interconnection between at least some of the interconnection structures of the first and second arrays on a one to one basis.

Moreover, the substrate may be an integrated circuit substrate such that the first surface is a device side of the substrate having electronic circuits (such as transistors, diodes, resistors, capacitors, and/or inductors) thereon and the second surface is a backside of the substrate. More particularly, the integrated circuit device may be an integrated circuit memory device.

According to still more embodiments of the present invention, an electronic device may include first, second, and third integrated circuit substrates with the second integrated circuit substrate being between the first and second integrated circuit substrates. At least one large bump may provide electrical and mechanical connection between the first and third integrated circuit substrates, and at least one small bump may provide electrical and mechanical connection between the second and third integrated circuit substrates wherein the at least one large bump has a greater volume than the at least one small bump.

DETAILED DESCRIPTION

Figure 1:
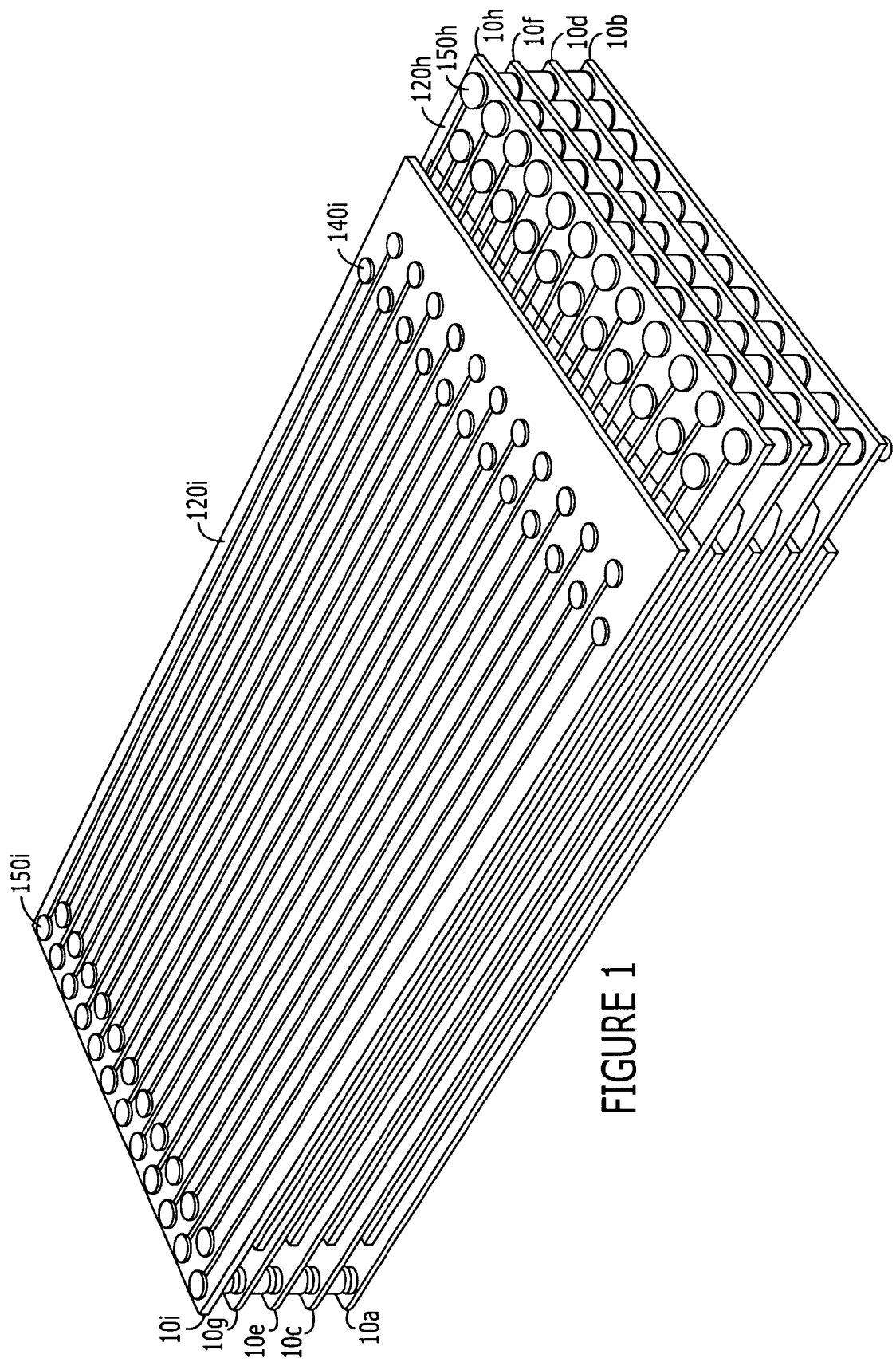
FIG. 1 is a top perspective view of an electronic device including stacked electronic substrates according to embodiments of the present invention.

The present invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer or substrate is referred to as being "on" another layer or substrate, it can be directly on the other layer or substrate, or intervening layers or substrates may also be present. It will also be understood that when an element is referred to as being "coupled" or "connected" to another element, it can be directly coupled or connected to the other element, or intervening elements may also be present. Like numbers refer to like elements throughout.

Figure 2A:
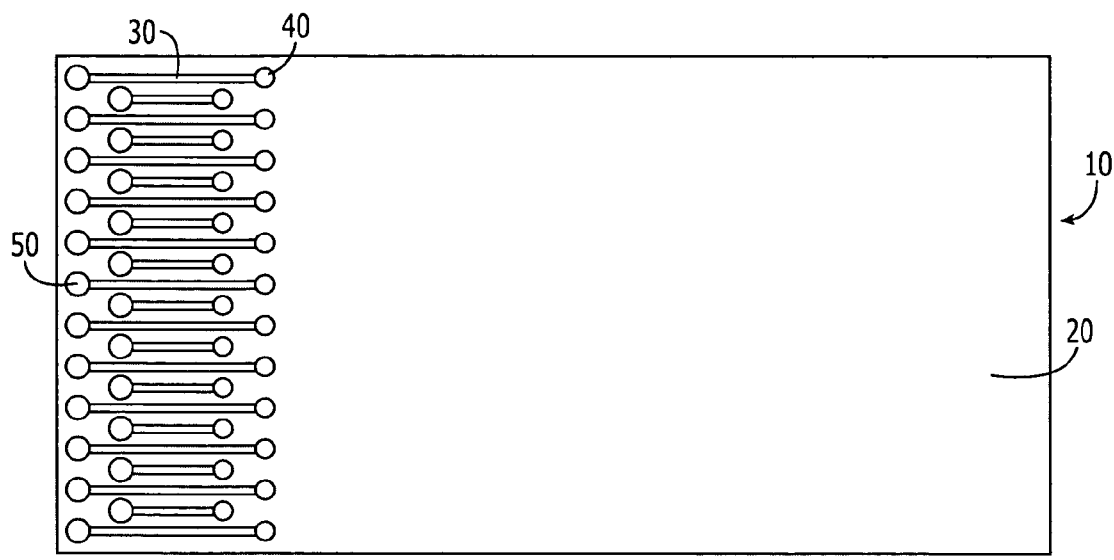
FIGS. 2a and 2b are respective views of a device side and a backside of an electronic substrate from the stack of FIG. 1 according to embodiments of the present invention.

Multilayer substrate (such as integrated circuit die) stacking structures according to embodiments of the present invention may provide ease of fabrication, testing, and assembly. In addition, rework of a completed stack of substrates may be accomplished by allowing removal and replacement of one or more substrates in the stack. FIG. 1 is a perspective view of a stack of nine substrates 10a-i according to embodiments of the present invention. FIG. 2a is a top view of a device side 20 of one of the substrates 10 of FIG. 1, and FIG. 2b is a top view of a backside 120 of one of the substrates 10 of FIG. 1.

As shown in FIG. 1, each substrate 10 may be slightly offset from adjacent substrates to allow room for inter-level vertical interconnections. The vertical interconnections can be formed of solder bumps of at least two different vertical dimensions. A first smaller dimension of interconnection bump may be used for adjacent substrate connections (such as between substrates 10a and 10b, between substrates 10b and 10c, between substrates 10c and 10d, between substrates 10d and 10e, between substrates 10e and 10f, between substrates 10f and 10g, between substrates 10g and 10h, and/or between substrates 10h and 10i). A second larger dimension of interconnection may be used to traverse more than one layer (such as between substrates 10a and 10c, between substrates 10b and 10d, between substrates 10c and 10e, between substrates 10d and 10f, between substrates 10e and 10g, between substrates 10f and 10h, and/or between substrates 10g and 10i). Moreover, the interconnections may be provided using conductive bumps such as solder bumps. In the structure illustrated in FIG. 1, the smaller bumps can be on the order of 50 microns in height while the larger bumps can be on the order of 250 microns in height. The substrates 10a-i (such as silicon substrates) may be thinned to less than the height of the large bump minus the joined height of the small bumps (for example, approximately 200 microns to 225 microns).

Conductive traces 30 and 130 may be formed of patterned metal layers on the device side 20 and on the backside 120 of the substrates 10a-i to thereby provide horizontal/lateral interconnections. The conductive traces 30 and 130 can interconnect linear arrays of conductive pads 40 and/or 50 and/or solder bumps 140 and/or 150 in a one-to-one relationship. While not visible in FIGS. 2a-b, conductive pads may also be provided on the device side 20 of the substrate 10 between the solder bumps 140 and/or 150 and the substrate 10.

Figure 2B:
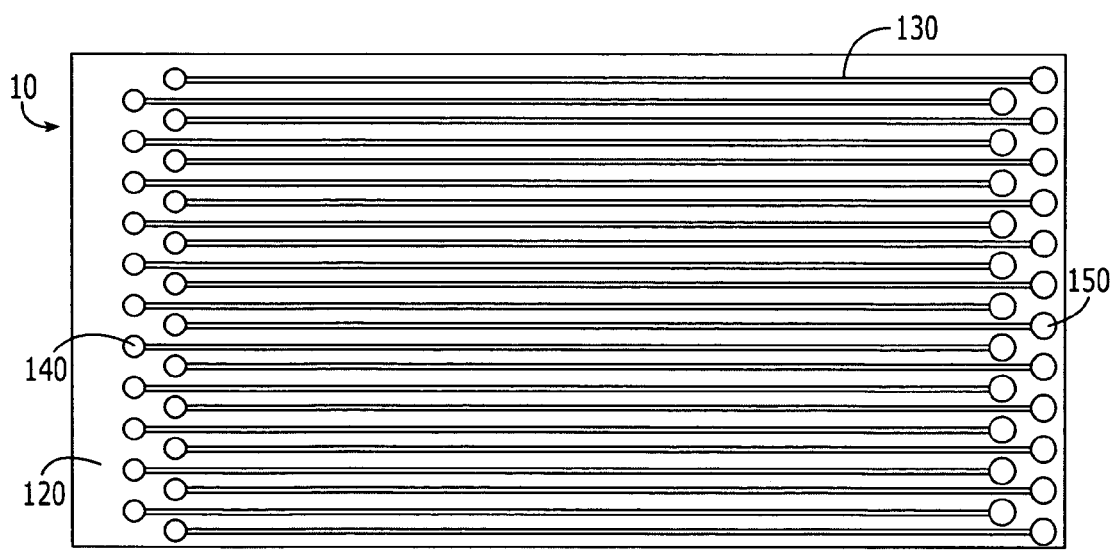

A device side 20 of a substrate 10 (such as an integrated circuit die) is illustrated in FIG. 2a, and a backside 120 of the substrate 10 is illustrated in FIG. 2b. In particular, the device side 20 may include electronic circuits (such as transistors, diodes, capacitors resistors, and/or capacitors) thereon, and the backside 120 may be free of electronic devices. Moreover, an insulating layer(s) may be provided on the device side 20 and/or the backside 120 to isolate the bumps 40 and/or 50, the conductive pads 140 and/or 150, and/or the conductive traces 30 and/or 130 from the substrate and/or electronic circuits thereon.

According to a particular example, each of the substrates 10 may be an integrated circuit device such as a solid state memory device (i.e. static random access memory, dynamic random assess memory, non-volatile memory, etc.). Accordingly, the electronic circuits on the device side 20 of the substrate 10 may provide memory device circuitry such as memory cells, input/output buffers, address decoders, amplifiers, etc. Moreover, an insulating layer (such as an oxide layer, nitride layer, etc.) may provide isolation between the electronic circuits of the memory device and the bumps 40 and/or 50 and/or the traces 30. Moreover, one or more vias in the insulating layer may provide contact between particular electronic circuits (such as input/output circuits) of the memory device and respective bumps 40 and/or 50 and/or traces 30.

The substrate 10 may also include an insulating layer (such as an oxide or nitride layer) on the backside 120 between a semiconductor portion of the substrate 10 and the conductive pads 140 and/or 150 and/or the traces 130. On the device side 20, conductive traces 30 (such as metal conductor lines) can be provided between large solder bumps 50 and smaller solder bumps 40. The conductive traces 30 may also be connected to active circuit(s) through vias (not shown), and the conductive traces 30 may be short relative to a long dimension of the substrate 10. In addition, the conductive traces 30 may be defined to include conductive pads between the solder bumps 40 and 50 and the substrate 10.

On the backside 120 of the substrate 10, conductive traces 130 (such as metal conductive lines) may be provided to electrically connect large pads 150 to small pads 140. In the illustrated example, the conductive traces 130 can have a length that is comparable to a length of the long dimension of the substrate 10. While relatively short traces 30 on the device side 20 and relatively long traces 130 on the backside 120 are illustrated in FIGS. 1 and 2a-b, it will be understood that the relative lengths of the traces on the device side 20 and backside 120 may be reversed, or the traces on the device side 20 and backside 120 may each extend approximately half a lengthwise dimension of the substrate 10. Moreover, solder bumps may be placed on the contact pads 140 and/or 150 of the backside 120 and contact pads of the device side 20 may be free of solder bumps until bonded with another substrate.

Figure 3:
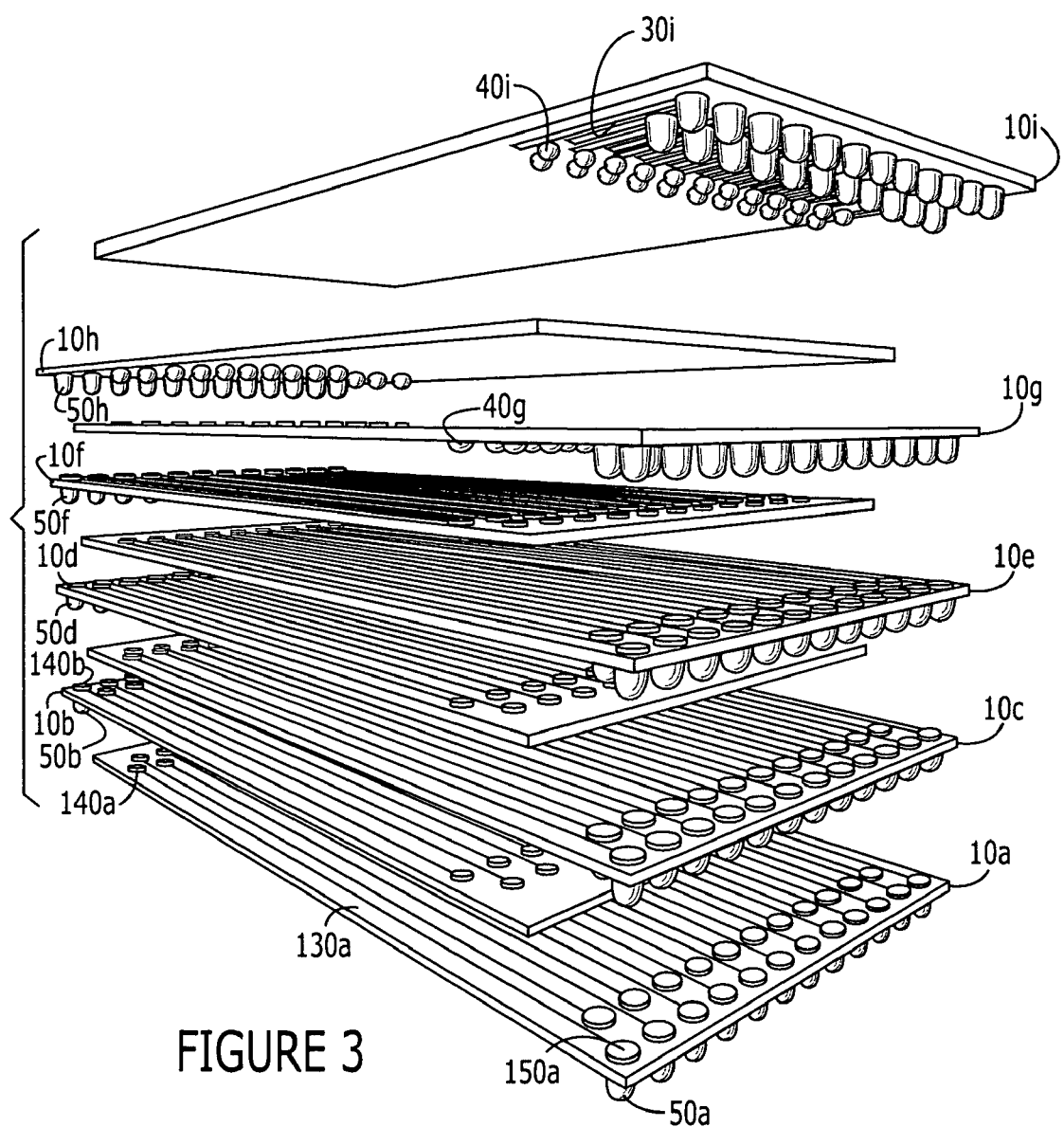
FIG. 3 is an exploded view of the electronic substrates of FIG. 1 according to embodiments of the present invention.
Figure 4:
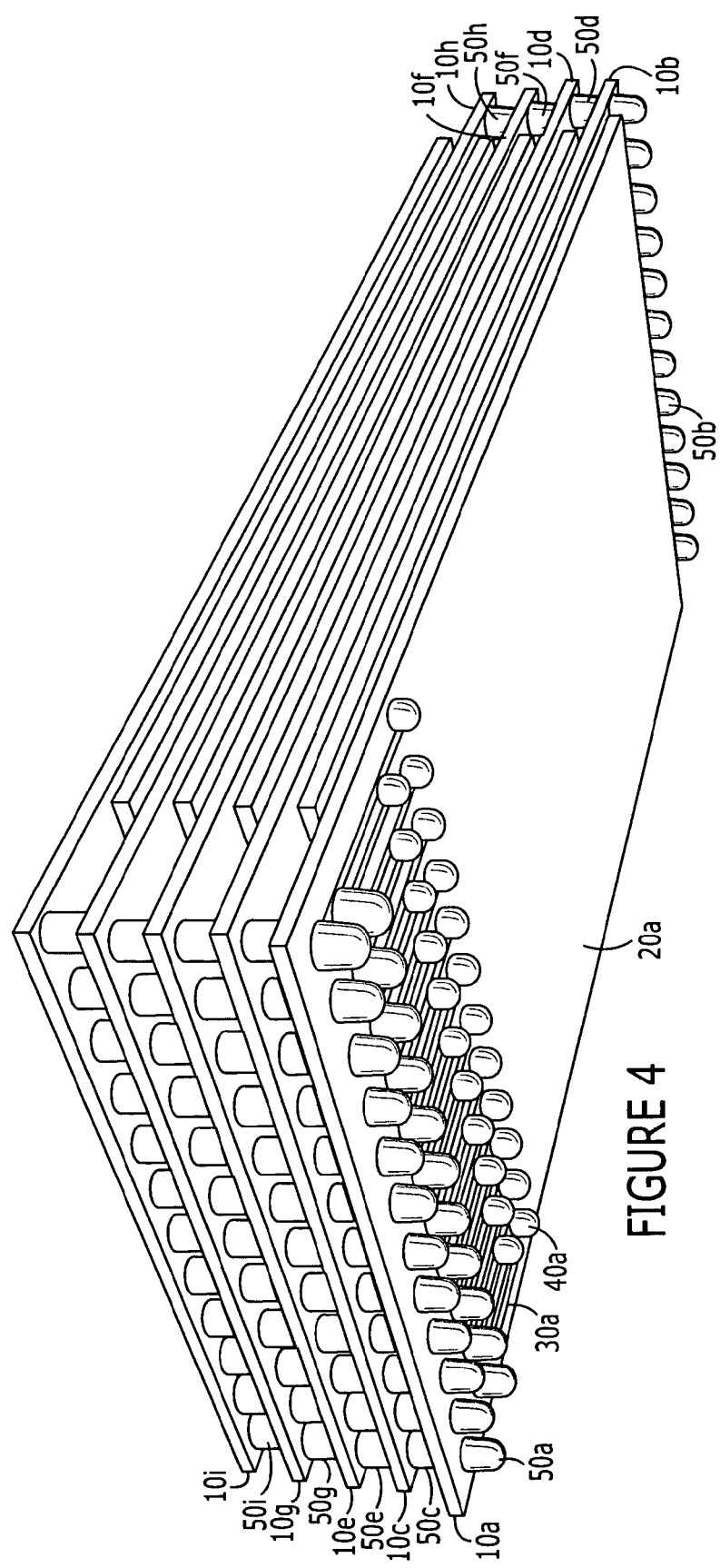
FIG. 4 is a bottom perspective view of the electronic device of FIG. 1 according to embodiments of the present invention.

When two substrates 10a and 10b are bonded together, active electronic circuits on the device side 20b of the second substrate 10b may be adjacent the backside 120a of the first substrate 10a and the small solder bumps 40b of the second substrate 10b may be joined to the matching small pads 140a of the first substrate 10a. The position of the small pads 140a may be such that the large solder bumps 50b of the second substrate extend past the edge of the first substrate 10a and enable connection to a substrate and/or printed circuit board below the first substrate 10a. A third substrate 10c can then be placed on the second substrate 10b such that the small solder bumps 40c of the third substrate 10c join to the small pads 140b of the second substrate 10b and the large solder bumps 50c of the third substrate 10c join to the large pads 150a of the first substrate 10a. An exploded view of such a stack is shown in FIG. 3, and a perspective bottom view of the completed stack is shown in FIG. 4.

Once the substrates 10a-i are aligned, the solder bumps can be heated above a melting temperature of the solder and cooled to provide electrical and mechanical connections between substrates. More particularly, contact pads 140 and 150 may provide wettable surfaces to which the solder bumps can bond.

Accordingly, the large bumps 50 may provide the trans-layer interconnection between substrates separated by one or more other substrates, and the small bumps 40 may provide adjacent-layer interconnection between adjacent substrates. The conductive traces 30 and 130 may tie the trans-layer and adjacent-layer interconnections together.

As shown in FIGS. 2a-b, the substrate 10 may have opposing first and second surfaces (e.g. the device side 20 and backside 120). The solder bumps 40 may provide a first array of interconnection structures on the device side 20 of the substrate 10, and the first array of interconnection structures may be arranged in a first pattern. The contact pads 140 may provide a second array of interconnection structures on the backside 120 of the substrate 10, and the second array of interconnection structures may be arranged in a second pattern and that is a mirror image of the first pattern. The solder bumps 50 may provide a third array of interconnection structures on the device side 20 of the substrate 10 spaced apart from the first array of interconnection structures, and the third array of interconnection structures may be arranged in a third pattern. The contact pads 150 may provide a fourth array of interconnection structures on the backside 120 of the substrate 10 spaced apart from the second array of interconnection structures, and the fourth array of interconnection structures may be arranged in a fourth pattern that is a mirror image of the third pattern.

The signal path 60 is discussed above as following from the substrate 210 through the bump 50a, through the conductive trace 30a, through the bump 40a, and across the substrate 210 to the bump 50b. It will be understood, however, that the signal may be separately provided from the substrate 210 to the bump 50b and to either the bump 40a and/or the bump 50a.

Figure 5:
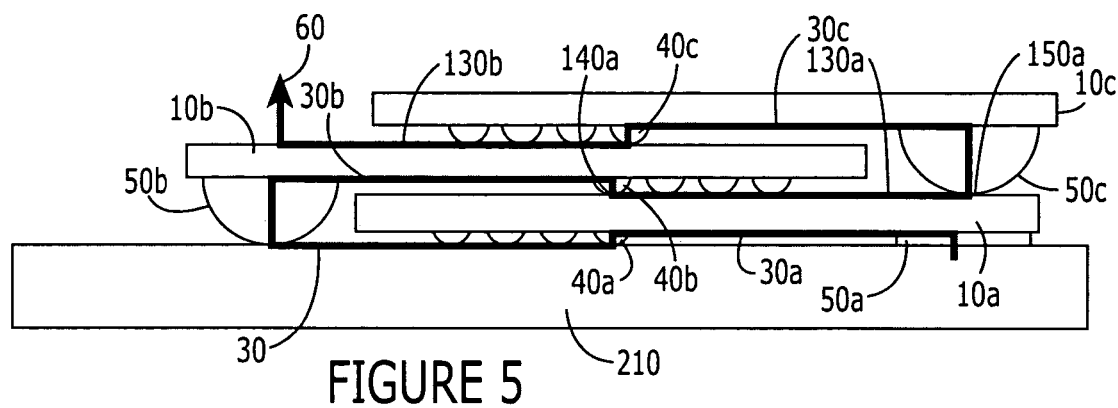
FIG. 5 is a cross sectional view of an electronic device including stacked electronic substrates according to embodiments of the present invention.

As shown in FIG. 5, large bump 50a may be connected between the substrate 10a and the substrate 210, and large bump 50b may be connected between the substrate 10b and the substrate 210. The substrate 10a, however, is closer to the substrate 210 than the substrate 10b. If bumps 50a and 50b of uniform size are placed on the respective substrates 10a and 10b prior to bonding with the substrate 210, a tilting of the stack of substrates 10a-c may result. According to embodiments of the present invention, sizes of solder wettable conductive pads on the substrate 210 can be varied to provide a relatively parallel orientation of the substrates 10a-c relative to the substrate 210. More particularly, a pad on the substrate 210 used to bond to the bump 50a may be larger than a pad on the substrate 210 used to bond to the bump 50b.

Parallel traces 30 and 130 may allow for all signals to be routed to every substrate. For example, the substrates 10 may be integrated circuit memory devices, and parallel traces 30 and 130 may provide a signal bus(es) providing one or more of data input, data output, and/or address input. Accordingly, a plurality of signal paths may be provided with each signal path being electrically coupled with an input and/or output of each stacked memory device. Parallel traces are illustrated in FIGS. 1, 2a-b, 3, and 4.

Figure 8:
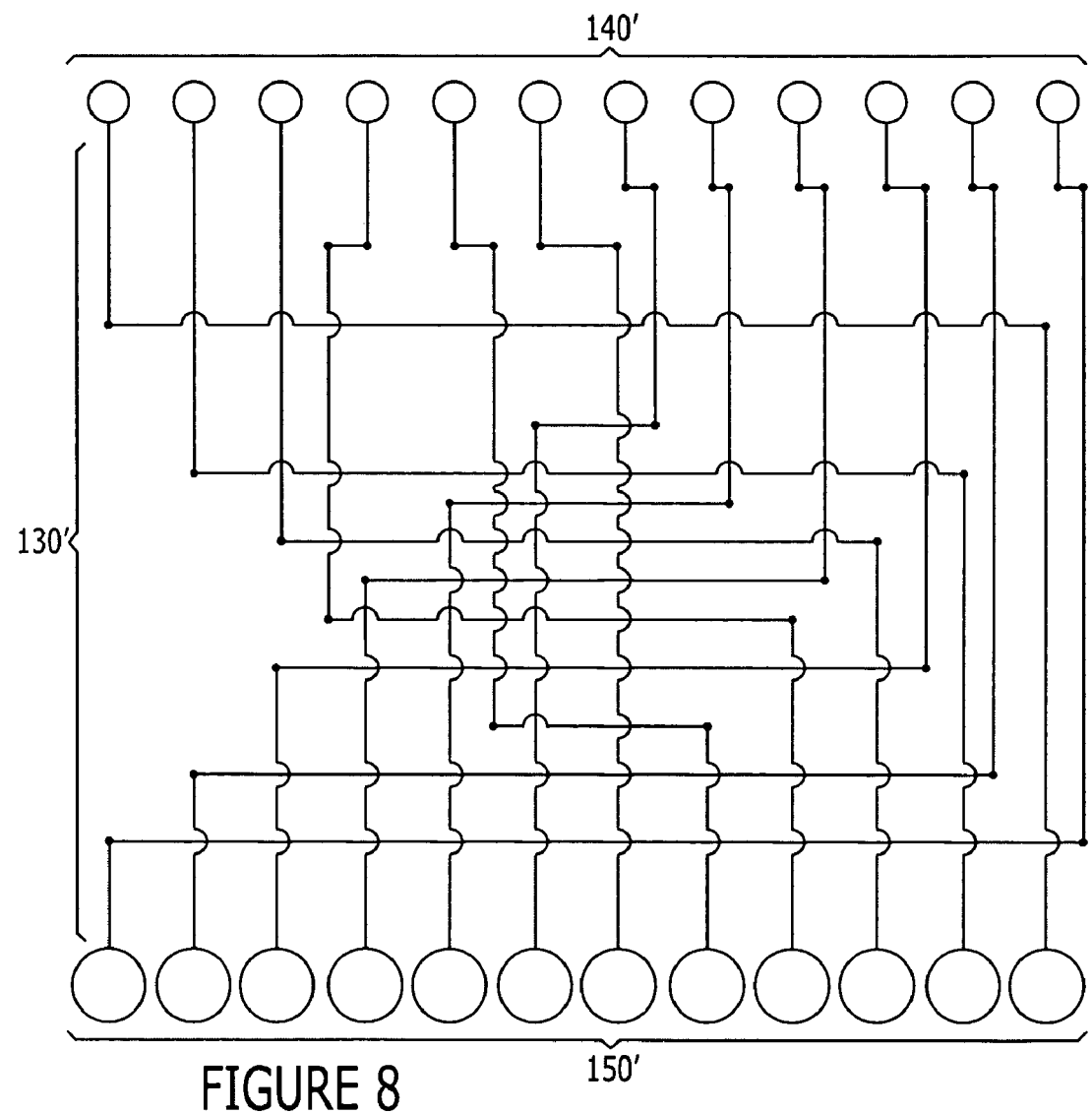
FIG. 8 illustrates examples of traces providing crossed electrical connection between conductive pads and/or bumps according to embodiments of the present invention.

In an alternative, the traces on the device side 20 and/or on the backside 120 may cross so that integrated circuit substrates 10 of identical layout can be stacked with adjacent substrates rotated in opposing directions (and facing a same direction) and so that a signal path is electrically coupled to a same input/output on each stacked substrate. For example, conductive traces 130' on backsides of substrates may cross as illustrated in FIG. 8. As shown, the conductive traces 130' may provide electrical connection between respective small conductive pads 140' and large conductive pads 150'. By reversing connections of traces 130' between large contact pads 150' and small contact pads 140', identical layouts of inputs/outputs and traces of substrates in the stack of FIGS. 1, 3, and 4 can be used with a particular signal path being electrically coupled to the same input/output of each substrate. While FIG. 8 shows that traces may cross on backsides of the substrates, traces may instead cross on devices sides of the substrates.

In some designs it may be desirable to have a unique signal path(s) provided for a particular substrate(s). In some structures including a stack of integrated circuit memory devices, a unique signal path(s) may be provided for a data input/output(s) and/or a chip select input(s) for each memory device in the stack.

Figure 6:
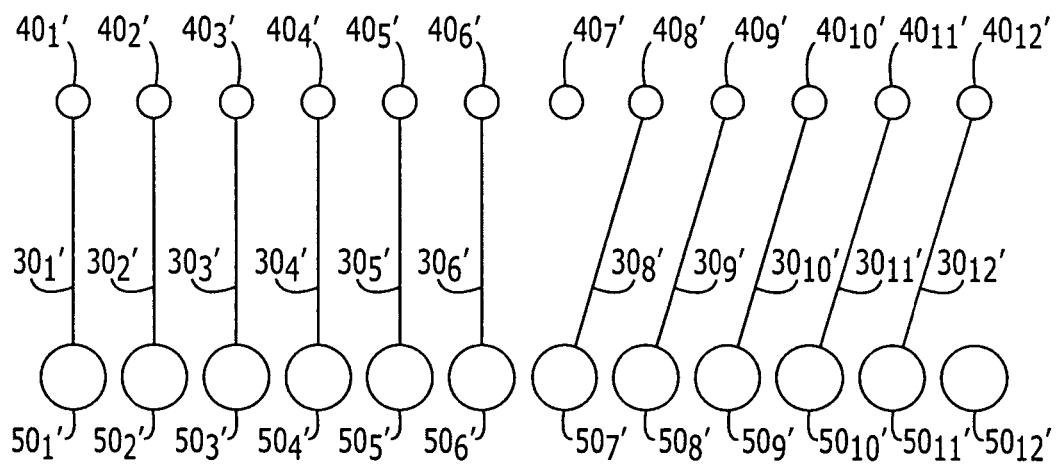
FIG. 6 illustrates examples of traces providing direct and shifted electrical connection between conductive pads and/or bumps according to embodiments of the present invention.

In such a case, certain of the conductive traces 30' on the device side of each substrate (such as conductive traces $30_{8-12}'$) can be shifted one position laterally as shown in FIG. 6. In FIG. 6, the signal paths including conductive traces $30_{1-6}'$ between small bumps $40_{1-6}'$ and large bumps $50_{1-6}'$ may continue through out a stack of substrates with interconnection to an input/output of each substrate in the stack. Accordingly, signal paths including conductive traces $30_{1-6}'$ may provide a bus(es) for distribution of data input/output and/or address input to each of substrates in a stack.

In contrast, signal paths including conductive traces $30_{8-12}'$ may shift one position over at each substrate in a stack, and the bump $50_{12}'$ for each substrate may terminate the unique signal path for that substrate. Signal paths through traces $30_{1-6}'$ may thus continue throughout the stack whereas signal paths through traces $30_{8-12}'$ may terminate one signal at each level. Accordingly, signal paths including conductive traces $30_{8-12}'$ may provide a unique signal path for each substrate for distribution of a unique data input/output and or chip select signal for each substrate. In the example of FIG. 6, the bump $50_{12}'$ may be coupled to a data input/output or chip select input for the substrate to receive the unique signal for the substrate. In the example of FIG. 6, the bumps $40_{7-12}'$ and $50_{7-11}'$ and the traces $30_{8-12}'$ are electrically isolated from inputs/outputs of the substrate and merely provide coupling of unique signal paths to other substrates in the stack further from the printed circuit board.

By way of example, a first substrate in a stack may receive a first unique signal from a printed circuit board through a bump $50_{12}'$ thereon connected to the printed circuit board. A second unique data signal for a second substrate can be received through a bump $50_{11}'$ of the first substrate, a third unique data signal for a third substrate can be received through bump $50_{10}'$ of the first substrate, a fourth unique data signal for a fourth substrate can be received through a bump $50_9'$ of the first substrate, a fifth unique data signal for a fifth substrate can be received through bump $50_8'$ of the first substrate, and a sixth unique data signal for a sixth substrate can be received through bump $50_7'$ of the first substrate. The second substrate (including a same arrangement of small and large bumps) may receive the second unique data signal through bump $50_{12}'$ thereon. The third through sixth unique data signals may be received and transmitted through bumps $50_{8-11}'$ and $40_{9-12}'$ and traces $30_{9-12}'$ of the second substrate without coupling to inputs/outputs of the second substrate. The third substrate (including a same arrangement of small and large bumps) may receive the third unique data signal through bump $50_{12}'$ thereon. The fourth through sixth unique data signals may be received and transmitted through bumps $50_{9-11}'$ and $40_{10-12}'$ and traces $30_{10-12}'$ of the third substrate without coupling to inputs/outputs of the third substrate. The fourth substrate (including a same arrangement of small and large bumps) may receive the fourth unique data signal through bump $50_{12}'$ thereon. The fifth and sixth unique data signals may be received and transmitted through bumps $50_{10\text{-}11}'$ and $40_{11\text{-}12}'$ and traces $30_{11\text{-}12}'$ of the fourth substrate without coupling to inputs/outputs of the fourth substrate. The fifth substrate (including a same arrangement of small and large bumps) may receive the fifth unique data signal through bump $50_{12}'$ thereon. The sixth unique data signal may be received and transmitted through bumps $50_{11}'$ and $40_{12}'$ and trace $30_{12}'$ of the fifth substrate without coupling to inputs/outputs of the third substrate.

In the example of a stacked structure discussed above with respect to the shifting traces of FIG. 6, some traces may be unused (redundant) in substrates of the stack. In particular, bumps $40_{7\text{-}8}'$ and $50_7'$ and trace $30_8'$ may be unused in the second substrate, bumps $40_{7\text{-}9}'$ and $50_{7\text{-}8}'$ and traces $30_{8\text{-}9}'$ may be unused in the third substrate, bumps $40_{7\text{-}10}'$ and $50_{7\text{-}9}'$ and traces $30_{8\text{-}10}'$ may be unused in the fourth substrate, bumps $40_{8\text{-}11}'$ and $50_{7\text{-}10}'$ and traces $30_{8\text{-}11}'$ may be unused in the fifth substrate, and bumps $40_{7\text{-}12}'$ and $50_{7\text{-}11}'$ and traces $30_{8\text{-}12}'$ may be unused in the sixth substrate. Accordingly, a same pattern of traces, pads, and bumps can be provided on stacked substrates (such as memory devices) having a same layout to provide a signal path(s) for data signals common to all substrates in the stack and to provide a signal path(s) unique for each of the substrates in the stack.

While the shifting of traces is discussed above with respect to traces on device sides of substrates in a stack, traces may alternately be shifted on backsides of substrates. Moreover, stacked substrates according to embodiments of the present invention may include both shifting traces (such as traces $30_{8\text{-}12}'$ illustrated in FIG. 6) and crossing traces (such as traces 130' illustrated in FIG. 8). By combining shifting traces and crossing traces, a same input/output layout may be provided for all memory devices in a stack, with a first input/output location of each memory device being coupled to a same signal path and with a second input/output location of each memory device being coupled to a signal path unique to that memory device. In addition, traces may shift and cross on the same or different sides of the substrates. In either case, a same layout of input/output locations, traces, contact pads, and bumps may be provided for each substrate in a stacked structure according to embodiments of the present invention wherein alternating substrates (such as memory devices) face a same direction (device sides toward a printed circuit board) with adjacent substrates being rotated 180 degrees relative to one another.

Figure 7:
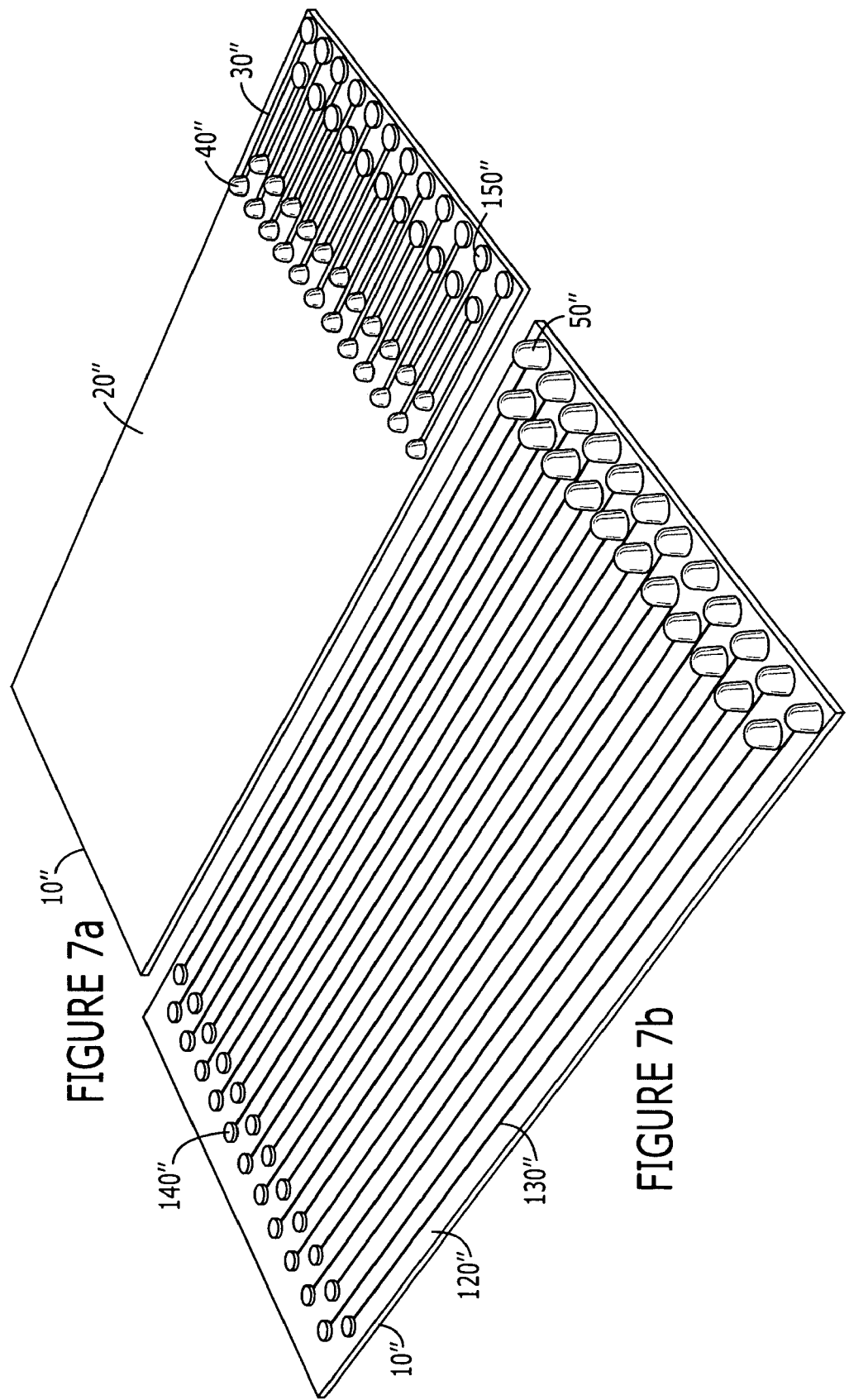
FIGS. 7a and 7b are device side and backside views of an electronic substrate according to alternate embodiments of the present invention.

As discussed above with regard to FIGS. 1, 2a-b, 3, and 4, all bumps 40 and 50 may be provided on device sides 120 of the substrates 10 prior to stacking and bonding, and solder wettable conductive pads 140 and 150 may be provided on backsides of the substrates 10 for bonding to solder bumps of other substrates in the stack. In an alternative illustrated in FIGS. 7a and 7b, solder bumps 50" may be provided on backsides 120" of substrates 10", and solder bumps 40" may be provided on device sides 20" of the substrates. Conductive traces 30" on device sides 20" of substrates 10" may thus connect bumps 40" and conductive pads 150", and conductive traces 130" on backsides 120" may connect bumps 50" and conductive pads 140". Accordingly, conductive pads 140" on a first substrate may be bonded to small solder bumps 40" on a second substrate, and conductive pads 150" on the first substrate may be bonded to large solder bumps 50" of a third substrate.

In another alternative, all of the solder bumps could be provided on the backsides of the substrates prior to stacking and bonding substrates. In yet another alternative, the small bumps could be placed on the backsides of substrates and the large bumps could be placed on the device sides of the substrates prior to stacking and bonding substrates. In still other embodiments, small bumps and/or large bumps can be placed on both device sides and backsides of substrates prior to stacking and bonding. Moreover, placement of long and short conductive traces could be reversed with respect to the device sides and backsides.

According to some embodiments of the present invention, conductive traces and/or pads may be formed on substrates by blanket deposition of metal followed by patterning, such as photolithographic patterning. Moreover, solder bumps may be formed by plating, such as electroplating. In an alternative, conductive traces, conductive pads, and/or bumps for the device sides and/or backsides of substrates may be separately formed on thin flexible substrates, and the thin flexible substrates can be bonded to the electronic substrates later.

Conductive bumps used for interconnection can be solder, solid metal, conductive organic material, or other known connection material. Likewise the conductive pads can be pins, posts, pillars, beams, springs, receptacles, sockets, and/or other mating structures for the conductive bumps. In addition, the large and small bumps may be defined to include a solder bump in combination with a conductive pad (such as an under bump metallurgy layer).

Although the description of this structure showed the electronic substrates as collinear relative to the long dimensions thereof, the stacked substrate structures according to embodiments of the present invention could be provided with substrates overlapping at other angles such as 30 degrees, 45 degrees, 60 degrees, or 90 degrees. Structures including stacked substrates according to embodiments of the present invention could also be combined with other stacking and/or interconnection structures to provide additional connectivity, unique signals to certain levels, and/or other features afforded by different interconnection structures.

According to embodiments of the present invention, a stacked structure of integrated circuit (IC) devices (such as illustrated in FIGS. 1 and 4) may be tested prior to bonding on a printed circuit board. If it is determined that a defective IC device in the stack should be replaced, a portion of the stack on one side of the defective IC device can be clamped with a first clamp, and the remainder of the stack can be clamped with a second clamp. The stack of IC devices can then be heated above a melting temperature of the solder bumps and the clamps separated to divide the stack. The defective IC device can then be replaced and the stack re-soldered.

For thermal management, thin, high thermal conductivity layers (having low electrical conductivity) can be provided between the substrates during the lay-up of the stack. For example, diamond-like composite (DLC) films and/or carbon fiber laminates of approximately 25 microns thickness can be provided between substrates of the stacks of FIGS. 1 and 4. Such materials may provide relatively low electrical conductivity and relatively high lateral thermal conductivity to improve dissipation of thermal energy. Moreover, the thermal conductivity layers may be connected to one or more heat sinks adjacent the stack. While the thermally conductive layers may desirably be electrically insulating, the property of being electrically insulating is not required. For example, an electrically conductive layer(s) may be used provided that it does not electrically short pads, bumps, and/or traces. In another alternative, the thermally conductive layer(s) may be electrically conductive with an electrically insulating layer thereon.

According to additional embodiments of the present invention, an electronic device may include at least first, second, and third electronic substrates, such as substrates 10b-d illustrated in FIGS. 1, 2a-b, 3, and 4. As shown, the second electronic substrate 10c may be between the first electronic substrate 10b and the second electronic substrate 10d. In addition, a first electrical and mechanical connection(s), such as solder bump(s) 50d, may be provided between the first electronic substrate 10b and the third electronic substrate 10d. Moreover, a second electrical and mechanical connection(s), such as solder bump(s) 40d, may be provided between the second electronic substrate 10c and the third electronic substrate 10d.

As shown in FIGS. 1 and 4, the second electronic substrate 10c may be offset relative to the first electronic substrate 10b and third electronic substrate 10d so that a first end of the second electronic substrate 10c extends beyond the first and third electronic substrates. In addition, the first electronic substrate 10b and third electronic substrate 10d may extend beyond a second end of the second electronic substrate 10c. As further shown in FIGS. 1 and 4, the first electronic substrate 10b may be stacked on additional substrates (such as electronic substrate 10a), and additional substrates (such as electronic substrate 10e) may be stacked on the third electronic substrate 10d.

Each of the first and third electronic substrates 10b and 10d may include a device side 20 having electronic circuits (such as transistors, resistors, capacitors, inductors, and/or diodes) thereon and a backside 120 free of electronic circuits thereon. Accordingly, the first and third electronic substrates may be integrated circuit devices such as integrated circuit memory devices. In addition, the second electronic substrate may also be an integrated circuit device such as an integrated circuit memory device. Moreover, device sides of the electronic substrates may face in a common direction.

In an alternative, one or more of the electronic substrates may be provided for interconnection only without providing electronic circuits therein. By way of example, even ones of the substrates of FIGS. 1 and 4 may be integrated circuit memory devices, and odd ones of the substrates of FIGS. 1 and 4 may be provided for interconnection only without providing memory functionality.

In addition, the stack of electronic substrates of FIGS. 1 and 4 may be bonded to a printed circuit board. Accordingly, stacked IC memory devices according to embodiments of the present invention may be used to increase memory capacity on a printed circuit board (PCB) without significantly increasing PCB real estate consumed by memory devices. Stacked electronic substrates according to embodiments of the present invention may thus be particularly suited for use in portable electronic devices such as personal digital assistants (PDAs), pocket computers, mobile radiotelephones, etc.

While stacks of substrates of a same size are discussed above, substrates of different sizes may be stacked and bonded according to embodiments of the present invention. Moreover, different redistributions of inputs/outputs to traces, pads, and/or bumps can be provided for different substrates in a stack according to embodiments of the present invention. For example, substrates may be stacked with odd substrates in the stack having a first orientation and with even substrates in the stack having a second orientation (i.e. rotated 180 degrees relative to the first substrate). More particularly, substrates in the first orientation may have a first redistribution of inputs/outputs to traces, pads, and/or bumps, and substrates in the second orientation may have a second redistribution of inputs/outputs to traces, pads, and/or bumps. More particularly, the redistribution may be reversed for substrates in the second orientation relative to substrates in the first orientation. Accordingly, a same data path may be connected to a same input/output of each substrate in the stack without crossing traces as discussed above with respect to FIG. 8. Moreover, substrates may be stacked without rotating according to still more embodiments of the present invention.

While this invention has been particularly shown and described with reference to embodiments thereof, it will be understood by those skilled in the art that various changes in form and details may be made therein without departing from the spirit and scope of the invention as defined by the appended claims and their equivalents.

That which is claimed is:

1. An electronic device comprising:
   a first integrated circuit substrate;
   a second integrated circuit substrate on the first integrated circuit substrate;
   a third integrated circuit substrate on the second integrated circuit substrate wherein the second integrated circuit substrate is between the first and third integrated circuit substrates;
   a first electrical and mechanical connection between the first and third integrated circuit substrates wherein the first electrical and mechanical connection bypasses the second integrated circuit substrate;
   a second electrical and mechanical connection between the second and third integrated circuit substrates; and
   a third electrical and mechanical connection between the first and second integrated circuit substrates;
   wherein the second integrated circuit substrate is offset relative to the first and third integrated circuit substrates so that the first and third integrated circuit substrates extend beyond an end of the second integrated circuit substrate.

2. An electronic device according to claim 1 wherein the first electrical and mechanical connection is between portions of the first and third integrated circuit substrates extending beyond the end of the second integrated circuit substrate.

3. An electronic device according to claim 2 further comprising:
   a conductive trace on a surface of the third integrated circuit substrate, the conductive trace providing an electrical coupling between the first and second electrical and mechanical connections.

4. An electronic device comprising:
   a first integrated circuit substrate;
   a second integrated circuit substrate on the first integrated circuit substrate;
   a third integrated circuit substrate on the second integrated circuit substrate wherein the second integrated circuit substrate is between the first and third integrated circuit substrates;
   a first electrical and mechanical connection between the first and third integrated circuit substrates wherein the first electrical and mechanical connection bypasses the second integrated circuit substrate;
   a second electrical and mechanical connection between the second and third integrated circuit substrates;
   a third electrical and mechanical connection between the first and second integrated circuit substrates; and
   a conductive trace on a surface of the first integrated circuit substrate, the conductive trace providing an electrical coupling between the first and third electrical and mechanical connections.

5. An electronic device comprising:
   a first integrated circuit substrate;

a second integrated circuit substrate on the first integrated circuit substrate;

a third integrated circuit substrate on the second integrated circuit substrate wherein the second integrated circuit substrate is between the first and third integrated circuit substrates;

a first electrical and mechanical connection between the first and third integrated circuit substrates wherein the first electrical and mechanical connection bypasses the second integrated circuit substrate;

a second electrical and mechanical connection between the second and third integrated circuit substrates; and a third electrical and mechanical connection between the first and second integrated circuit substrates;

wherein the first electrical and mechanical connection comprises a first conductive bump between the first and third integrated circuit substrates, wherein the first conductive bump is spaced apart from and extends past an edge of the second integrated circuit substrate, and wherein the second electrical and mechanical connection comprises a second conductive bump between the second and third integrated circuit substrates.

6. An electronic device according to claim 5 wherein the first conductive bump has a greater volume than the second conductive bump.

7. An electronic device according to claim 5 wherein each of the first, second, and third integrated circuit substrates has a same length and width.

8. An electronic device according to claim 5 wherein each of the first, second, and third integrated circuit substrates is an integrated circuit memory device.

9. An electronic device according to claim 5 wherein each of the first, second, and third integrated circuit substrates is a semiconductor integrated circuit substrate.

10. An electronic device comprising:
a first integrated circuit substrate;
a second integrated circuit substrate on the first integrated circuit substrate;
a third integrated circuit substrate on the second integrated circuit substrate wherein the second integrated circuit substrate is between the first and third integrated circuit substrates;
a first conductive bump between the first and third integrated circuit substrates wherein the first conductive bump is spaced apart from and extends past an edge of the second integrated circuit substrate wherein the first conductive bump provides electrical and mechanical connection between the first and third integrated circuit substrates; and
a second conductive bump between the second and third integrated circuit substrates wherein the second conductive bump provides electrical and mechanical connection between the second and third integrated circuit substrates;
wherein each of the first, second, and third integrated circuit substrates includes a device side having electronic circuits thereon and a backside, wherein the device sides of the first, second, and third integrated circuit substrates face a first direction, and the backsides of the first, second, and third integrated circuit substrates face a second direction.

11. An electronic device according to claim 10 wherein both of the first and third integrated circuit substrates are integrated circuit memory devices.

12. An electronic device according to claim 11 wherein the first and third integrated circuit substrates comprise memory devices having a same layout.

13. An electronic device according to claim 11 wherein both of the first and second conductive bumps are electrically coupled to a data input, a data output, and/or an address input of the third integrated circuit substrate.

14. An electronic device according to claim 13 wherein the second integrated circuit substrate is an integrated circuit memory device.

15. An electronic device according to claim 13 wherein each of the first, second, and third integrated circuit substrates comprises a rectangular substrate having a length and a width such that the lengths and the widths of each of the first, second, and third integrated circuit substrates are the same, and wherein lengthwise directions of each of the first, second, and third integrated circuit substrates are arranged in parallel.

16. An electronic device according to claim 14 wherein both of the first and second conductive bumps are electrically coupled to a data input, a data output, and/or an address input of the second integrated circuit substrate, and to a data input, a data output, and/or an address input of the first integrated circuit substrate.

17. An electronic device according to claim 10 wherein each of the first, second, and third integrated circuit substrates is a semiconductor integrated circuit substrate.

18. An electronic device comprising:
a first integrated circuit substrate;
a second integrated circuit substrate on the first integrated circuit substrate;
a third integrated circuit substrate on the second integrated circuit substrate wherein the second integrated circuit substrate is between the first and third integrated circuit substrates;
a first conductive bump between the first and third integrated circuit substrates wherein the first conductive bump is spaced apart from and extends past an edge of the second integrated circuit substrate wherein the first conductive bump provides electrical and mechanical connection between the first and third integrated circuit substrates;
a second conductive bump between the second and third integrated circuit substrates wherein the second conductive bump provides electrical and mechanical connection between the second and third integrated circuit substrates;
a printed circuit board, wherein the first, second, and third integrated circuit substrates have device sides facing the printed circuit board and backsides facing away from the printed circuit board;
a third conductive bump between the first integrated circuit substrate and the printed circuit board wherein the third conductive bump provides electrical and mechanical connection between the first integrated circuit substrate and the printed circuit board;
a fourth conductive bump between the second integrated circuit substrate and the printed circuit board wherein the fourth conductive bump provides electrical and mechanical connection between the second integrated circuit substrate and the printed circuit board; and
a fifth conductive bump between the second integrated circuit substrate and the first integrated circuit substrate wherein the fifth conductive bump provides electrical and mechanical connection between the first and second integrated circuit substrates.

19. An electronic device according to claim 18 wherein the printed circuit board includes a first conductive pad to which the third conductive bump is bonded and a second conductive pad to which the fourth conductive bump is bonded, wherein the first conductive pad has a greater surface area than the second conductive pad.

20. An electronic device according to claim 18 further comprising:
a first conductive trace on the printed circuit board providing electrical coupling between the third and fourth conductive bumps;
a second conductive trace on the second integrated circuit substrate providing electrical coupling between the fourth and fifth conductive bumps; and
a third conductive trace on the first substrate providing electrical coupling between the fifth and first conductive bumps.

21. An electronic device according to claim 20 wherein the first and third conductive bumps are electrically coupled to a data input, a data output, and/or an address input of the first integrated circuit substrate, and wherein the first and third conductive bumps are electrically coupled to a data input, a data output, and/or an address input of the third integrated circuit substrate.

22. An electronic device according to claim 18 wherein the fourth conductive bump is spaced apart from and extends past an edge of the first integrated circuit substrate.

23. An electronic device according to claim 18 wherein each of the first, second, and third integrated circuit substrates is a semiconductor integrated circuit substrate.

24. An electronic device comprising:
a first integrated circuit substrate;
a second integrated circuit substrate on the first integrated circuit substrate;
a third integrated circuit substrate on the second integrated circuit substrate wherein the second integrated circuit substrate is between the first and third integrated circuit substrates;
a first conductive bump between the first and third integrated circuit substrates wherein the first conductive bump is spaced apart from and extends past an edge of the second integrated circuit substrate wherein the first conductive bump provides electrical and mechanical connection between the first and third integrated circuit substrates;
a second conductive bump between the second and third integrated circuit substrates wherein the second conductive bump provides electrical and mechanical connection between the second and third integrated circuit substrates;
a fourth integrated circuit substrate on the third integrated circuit substrate so that the third integrated circuit substrate is between the second and fourth integrated circuit substrates;
a fifth integrated circuit substrate on the fourth integrated circuit substrate so that the fourth integrated circuit substrate is between the third and fifth integrated circuit substrates;
a third conductive bump between the second and fourth integrated circuit substrates wherein the third conductive bump provides electrical and mechanical connection between the second and fourth integrated circuit substrates;
a fourth conductive bump between the fourth and third integrated circuit substrates wherein the fourth conductive bump provides electrical and mechanical connection between the fourth and third integrated circuit substrates; and
a fifth conductive bump between the third and fifth integrated circuit substrates wherein the fifth conductive bump provides electrical and mechanical connection between the third and fifth integrated circuit substrates;
wherein the first, second, third, fourth and fifth conductive bumps comprise portions of a signal path, wherein a direct electrical coupling is provided between the signal path and an electronic circuit of the fifth integrated circuit substrate, and wherein the signal path is free of a direct electrical coupling with any electronic circuit of the third integrated circuit substrate.

25. An electronic device according to claim 24 wherein the first, second, third, fourth, and fifth integrated circuit substrates have device sides facing a first direction and backsides facing a second direction.

26. An electronic device according to claim 24 wherein each of the first, second, third, fourth, and fifth integrated circuit substrates is a semiconductor integrated circuit substrate.

27. An electronic device comprising:
a printed circuit board;
a first integrated circuit substrate on the printed circuit board;
a second integrated circuit substrate on the first integrated circuit substrate wherein the first integrated circuit substrate is between the printed circuit board and the second integrated circuit substrate; and
a third integrated circuit substrate on the second integrated circuit substrate wherein the second integrated circuit substrate is between the first and third integrated circuit substrates, wherein the second integrated circuit substrate is offset relative to the first and third integrated circuit substrates so that the first and third integrated circuit substrates extend beyond a first end of the second integrated circuit substrate wherein a second end of the second integrated circuit substrate extends beyond the first and third integrated circuit substrates wherein each of the first, second, and third integrated circuit substrates is on a same side of the printed circuit board and wherein each of the first, second, and third integrated circuit substrates has a device side facing the printed circuit board and a backside facing away from the printed circuit board.

28. An electronic device according to claim 27 wherein the first and second ends of the second integrated circuit substrate comprise first and second opposing ends of the second integrated circuit substrate.

29. An electronic device according to claim 27 wherein the first, second, and third integrated circuit substrates have devices sides facing the printed circuit board and backsides facing away from the printed circuit board, the electronic device further comprising:
a first conductive bump between the first and third integrated circuit substrates wherein the first conductive bump provides electrical and mechanical connection between the first and third integrated circuit substrates;
a second conductive bump between the second and third integrated circuit substrates wherein the second conductive bump provides electrical and mechanical connection between the second and third integrated circuit substrates;
a third conductive bump between the first integrated circuit substrate and the printed circuit board wherein the third conductive bump provides electrical and mechanical connection between the first integrated circuit substrate and the printed circuit board;
a fourth conductive bump between the second integrated circuit substrate and the printed circuit board wherein the fourth conductive bump provides electrical and mechanical connection between the second integrated circuit substrate and the printed circuit board; and a fifth conductive bump between the second integrated circuit substrate and the first integrated circuit substrate wherein the fifth conductive bump provides electrical and mechanical connection between the first and second integrated circuit substrates.

30. An electronic device according to claim 29 further comprising:
a first conductive trace on the printed circuit board providing electrical coupling between the third and fourth conductive bumps;
a second conductive trace on the second substrate providing electrical coupling between the fourth and fifth conductive bumps; and
a third conductive trace on the first substrate providing electrical coupling between the fifth and first conductive bumps.

31. An electronic device according to claim 30 wherein the first and third conductive bumps are electrically coupled to a data input, a data output, and/or an address input of the first substrate, and wherein the first and third conductive bumps are electrically coupled to a data input, a data output, and/or an address input of the third substrate.

32. An electronic device according to claim 29 wherein the printed circuit board includes a first conductive pad to which the third conductive bump is bonded and a second conductive pad to which the fourth conductive bump is bonded, wherein the first conductive pad has a greater surface area than the second conductive pad.

33. An electronic device according to claim 27 further comprising:
a fourth integrated circuit substrate on the third integrated circuit substrate wherein the third integrated circuit substrate is between the second and fourth integrated circuit substrates;
a fifth integrated circuit substrate on the fourth integrated circuit substrate wherein the fourth integrated circuit substrate is between the third and fifth integrated circuit substrates, wherein the fourth integrated circuit substrate is offset relative to the first, third, and fifth integrated circuit substrates so that the second end of the second integrated circuit substrate extends beyond the first, third, and fifth integrated circuit substrates, and so that the first, third, and fifth integrated circuit substrates extend beyond the fourth integrated circuit substrate.

34. An electronic device comprising:
a printed circuit board;
a first integrated circuit substrate on the printed circuit board;
a second integrated circuit substrate on the first integrated circuit substrate wherein the first integrated circuit substrate is between the printed circuit board and the second integrated circuit substrate;
a third integrated circuit substrate on the second integrated circuit substrate wherein the second integrated circuit substrate is between the first and third integrated circuit substrates, wherein the second integrated circuit substrate is offset relative to the first and third integrated circuit substrates so that the first and third integrated circuit substrates extend beyond an end of the second integrated circuit substrate;
a first conductive bump between the first and third integrated circuit substrates, wherein the first conductive bump provides electrical and mechanical connection between the first and third integrated circuit substrates; and a second conductive bump between the second and third integrated circuit substrates wherein the second conductive bump provides electrical and mechanical connection between the second and third integrated circuit substrates.

35. An electronic device according to claim 34 wherein the first conductive bump is between portions of the first and third integrated circuit substrates extending beyond the end of the second integrated circuit substrate.

36. An electronic device according to claim 34 wherein each of the first, second, and third integrated circuit substrates is a semiconductor integrated circuit substrate.

37. An electronic device according to claim 34 further comprising:
a conductive trace on a surface of the third integrated circuit substrate, the conductive trace providing an electrical coupling between the first and second conductive bumps.

38. An electronic device according to claim 34 further comprising:
a third conductive bump between the first and second integrated circuit substrates.

39. An electronic device according to claim 38 further comprising:
a conductive trace on a surface of the first integrated circuit substrate, the conductive trace providing an electrical coupling between the first and third conductive bumps.

40. An electronic device comprising:
a printed circuit board;
a first integrated circuit substrate on the printed circuit board;
a second integrated circuit substrate on the first integrated circuit substrate wherein the first integrated circuit substrate is between the printed circuit board and the second integrated circuit substrate;
a third integrated circuit substrate on the second integrated circuit substrate wherein the second integrated circuit substrate is between the first and third integrated circuit substrates, wherein the second integrated circuit substrate is offset relative to the first and third integrated circuit substrates so that the first and third integrated circuit substrates extend beyond an end of the second integrated circuit substrate;
a first conductive bump between the first and third integrated circuit substrates, wherein the first conductive bump provides electrical and mechanical connection between the first and third integrated circuit substrates; and
a second conductive bump between the second and third integrated circuit substrates, wherein the second conductive bump provides electrical and mechanical connection between the second and third integrated circuit substrates;
wherein the first, second, and third integrated circuit substrates have a same size.

41. An electronic device according to claim 40 wherein the first conductive bump has a greater volume than the second conductive bump.

42. An electronic device according to claim 40 wherein each of the first, second, and third integrated circuit substrates is a semiconductor integrated circuit substrate and wherein the first conductive bump is connected between portions of the first and third semiconductor integrated circuit substrates that extend beyond the end of the second semiconductor integrated circuit substrate.

43. An electronic device comprising:
a printed circuit board;

a first integrated circuit substrate on the printed circuit board;

a second integrated circuit substrate on the first integrated circuit substrate wherein the first integrated circuit substrate is between the printed circuit board and the second integrated circuit substrate; and a third integrated circuit substrate on the second integrated circuit substrate wherein the second integrated circuit substrate is between the first and third integrated circuit substrates, wherein the second integrated circuit substrate is offset relative to the first and third integrated circuit substrates so that the first and third integrated circuit substrates extend beyond an end of the second integrated circuit substrate;

wherein each of the first, second, and third integrated circuit substrates includes a device side having electronic circuits thereon and a backside, wherein each of the first, second, and third integrated circuit substrates is on a same side of the printed circuit board and wherein the device side of each of the first, second, and third integrated circuit substrates faces the printed circuit board and the backside of each of the first, second, and third integrated circuit electronic devices faces away from the printed circuit board.

44. An electronic device according to claim 43 wherein each of the first, second, and third integrated circuit substrates are integrated circuit memory devices.

45. An electronic device according to claim 44 further comprising:
a first conductive bump between the first and third integrated circuit substrates wherein the first conductive bump provides electrical and mechanical connection between the first and third integrated circuit substrates; and
a second conductive bump between the second and third integrated circuit substrates, wherein both of the first and second conductive bumps are electrically coupled to a data input, a data output, and/or an address input of the third integrated circuit substrate wherein the second conductive bump provides electrical and mechanical connection between the second and third integrated circuit substrates.

46. An electronic device according to claim 45 wherein both of the first and second conductive bumps are electrically coupled to a data input, a data output, and/or an address input of the second integrated circuit substrate, and to a data input, a data output, and/or an address input of the first integrated circuit substrate.

47. An electronic device according to claim 44 wherein the first, second, and third integrated circuit substrates are memory devices having a same layout.

48. An electronic device comprising:
a first integrated circuit substrate having opposing first and second surfaces;
a second integrated circuit substrate on the first integrated circuit substrate, the second integrated circuit substrate having opposing first and second surfaces;
a third integrated circuit substrate on the second integrated circuit substrate, the third integrated circuit substrate having opposing first and second surfaces, wherein the second integrated circuit substrate is between the first and third integrated circuit substrates, wherein the first surface of the second integrated circuit substrate faces the second surface of the first integrated circuit substrate, and wherein the second surface of the second integrated circuit substrate faces the first surface of the third integrated circuit substrate; and a signal path extending along a first conductive trace on the first surface of the second integrated circuit substrate, to the second surface of the first integrated circuit substrate, along a second conductive trace on the second surface of the first integrated circuit substrate, to the first surface of the third integrated circuit substrate, along a third conductive trace on the first surface of the third integrated circuit substrate, and to the second surface of the second integrated circuit substrate.

49. An electronic device according to claim 48 wherein the signal path comprises a first conductive bump between the first surface of the second integrated circuit substrate and the second surface of the first integrated circuit substrate, a second conductive bump between the second surface of the first integrated circuit substrate and the first surface of the third integrated circuit substrate, and a third conductive bump between the first surface of the third integrated circuit substrate and the second surface of the second integrated circuit substrate.

50. An electronic device according to claim 49 wherein wherein the first conductive bump provides electrical and mechanical connection between the first and second integrated circuit substrates, wherein the second conductive bump provides electrical and mechanical connection between the first and third integrated circuit substrates, and wherein the third conductive bump provides electrical and mechanical connection between the third and second integrated circuit substrates.

51. An electronic device according to claim 48 wherein the first side of the first and third integrated circuit substrates comprises a device side and wherein the second side of the first and third substrates comprises a backside.

52. An electronic device according to claim 51 wherein the signal path is electrically coupled to an electronic circuit of the third integrated circuit substrate.

53. An electronic device according to claim 51 wherein the first side of the second integrated circuit substrate comprises a device side and wherein the second side of the second integrated circuit substrate comprises a backside.

54. An electronic device according to claim 53 wherein the signal path is electrically coupled to an electronic circuit of the second integrated circuit substrate and to an electronic circuit of the third integrated circuit substrate.

55. An electronic device according to claim 53 wherein the first, second, and third integrated circuit substrates are respective integrated circuit memory devices.

56. An electronic device according to claim 48 further comprising:
a fourth integrated circuit substrate on the third integrated circuit substrate wherein the third integrated circuit substrate is between the second and fourth integrated circuit substrates; and
wherein the signal path further extends along the second surface of the second integrated circuit substrate, and to a first surface of the fourth integrated circuit substrate.

57. An electronic device according to claim 56 wherein the signal path is electrically coupled with electronic circuits of the second and fourth integrated circuit substrates.

58. An electronic device comprising:
a first integrated circuit substrate having opposing first and second surfaces;
a second integrated circuit substrate on the first integrated circuit substrate, the second integrated circuit substrate having opposing first and second surfaces;
a third integrated circuit substrate on the second integrated circuit substrate, the third integrated circuit substrate having opposing first and second surfaces, wherein the second integrated circuit substrate is between the first and third integrated circuit substrates;

a signal path extending along the first surface of the second integrated circuit substrate, to the second surface of the first integrated circuit substrate, along the second surface of the first integrated circuit substrate, to the first surface of the third integrated circuit substrate, along the first surface of the third integrated circuit substrate, and to the second surface of the second integrated circuit substrate; and a fourth integrated circuit substrate on the third integrated circuit substrate wherein the third integrated circuit substrate is between the second and fourth integrated circuit substrates; and wherein the signal path further extends along the second surface of the second integrated circuit substrate, and to a first surface of the fourth integrated circuit substrate;

wherein the signal path is electrically coupled directly with an electronic circuit of the fourth integrated circuit substrate, and wherein the signal path is free of direct electrical coupling with any electronic circuit of the second integrated circuit substrate.

59. An electronic device comprising:

a substrate having opposing first and second surfaces;

a first array of interconnection structures on the first surface of the substrate wherein the first array of interconnection structures are arranged in a first pattern;

a second array of interconnection structures on the second surface of the substrate wherein the second array of interconnection structures are arranged in a second pattern and wherein the second pattern is a mirror image of the first pattern wherein the substrate comprises an integrated circuit substrate such that the first surface is a device side of the substrate having electronic circuits thereon and the second surface is a backside of the substrate.

60. An electronic device according to claim 59 wherein the first array of interconnection structures comprises an array of interconnection bumps and wherein the second array of interconnection structures comprises an array of conductive pads free of interconnection bumps.

61. An electronic device according to claim 60 wherein the interconnection bumps comprise solder bumps and wherein the conductive pads comprise solder wettable pads.

62. An electronic device according to claim 59 further comprising:

a third array of interconnection structures on the first surface of the substrate spaced apart from the first array of interconnection structures wherein the third array of interconnection structures are arranged in a third pattern;

a fourth array of interconnection structures on the second surface of the substrate spaced apart from the second array of interconnection structures wherein the fourth array of interconnection structures are arranged in a fourth pattern, wherein the fourth pattern is a mirror image of the third pattern.

63. An electronic device according to claim 62 further comprising:

a first plurality of conductive traces on the first surface of the substrate wherein the first plurality of conductive traces provide interconnection between at least some of the interconnection structures of the first and second arrays on a one to one basis.

64. An electronic device according to claim 59 wherein the integrated circuit substrate is an integrated circuit memory device.

65. An electronic device according to claim 59 wherein the backside of the substrate is free of electronic circuits.

66. An electronic device according to claim 59 wherein the substrate is a semiconductor integrated circuit substrate.

67. An electronic assembly comprising:

a first integrated circuit substrate;

a second integrated circuit substrate on the first integrated circuit substrate; and a third integrated circuit substrate on the second integrated circuit substrate wherein the second integrated circuit substrate is between the first and third integrated circuit substrates, wherein the second integrated circuit substrate is offset relative to the first and third integrated circuit substrates so that the first and third integrated circuit substrates extend beyond a first end of the second integrated circuit substrate wherein a second end of the second integrated circuit substrate extends beyond the first and third integrated circuit substrates wherein the first, second, and third integrated circuit substrates are configured to be mounted on a same side of a printed circuit board so that device sides of the first, second, and third integrated circuit substrates face the printed circuit board and so that backsides of the first, second, and third integrated circuit substrates face away from the printed circuit board.

68. An electronic assembly according to claim 67 further comprising:

a first conductive bump between the first and third integrated circuit substrates wherein the first conductive bump provides electrical and mechanical connection between the first and third integrated circuit substrates; and a second conductive bump between the second and third integrated circuit substrates wherein the second conductive bump provides electrical and mechanical connection between the second and third integrated circuit substrates.

69. An electronic assembly according to claim 68 wherein the first, second, and third integrated circuit substrates have a same size.

70. An electronic assembly according to claim 68 wherein the first conductive bump is between portions of the first and third integrated circuit substrates extending beyond the end of the second integrated circuit substrate.

71. An electronic assembly according to claim 68 further comprising:

a conductive trace on a surface of the third integrated circuit substrate, the conductive trace providing an electrical coupling between the first and second conductive bumps.

* * * * *

UNITED STATES PATENT AND TRADEMARK OFFICE
CERTIFICATE OF CORRECTION

| | | |
|---|---|---|
| PATENT NO. | : 7,495,326 B2 | Page 1 of 1 |
| APPLICATION NO. | : 10/689976 | |
| DATED | : February 24, 2009 | |
| INVENTOR(S) | : Rinne | |

It is certified that error appears in the above-identified patent and that said Letters Patent is hereby corrected as shown below:

Column 9, Line 30: Please insert the following paragraph:
-- As shown in the cross section of Figure 5, a stack of substrates 10a-c may be mounted on a substrate 210 (such as a printed circuit board PCB) on which conductors have been provided corresponding to the small solder bumps 40, the conductive traces 30, and the large solder bumps 50. A signal path 60, for example, may be provided from the substrate 210 through large bump 50a into conductive trace 30a along the device side of the substrate 10a to small bump 40a, and then down to a small pad 240 on the substrate 210 below, then across the face of the substrate 210 and up through the large bump 50b of the second substrate 50b. The signal may then traverse the device side (active face) of the second substrate 10b through conductive trace 30b and down through small bump 40b into the small pad 140a on the backside (inactive face) of the first substrate 10a, and then through conductive trace 130a to the large pad 150a and up through the large bump 50c of the third substrate 10c. This zig-zag interconnection topology may continues up through a stack of any number of substrates 10. --
Column 16, Claim 15, Line 8: Please correct "claim 13" to read -- claim 14 --
Column 20, Claim 36, Line 10: Please correct "claim 34" to read -- claim 35 --

Signed and Sealed this
Nineteenth Day of July, 2011

David J. Kappos
*Director of the United States Patent and Trademark Office*